United States Patent [19]

Ohsawa

[11] Patent Number: 5,717,694
[45] Date of Patent: Feb. 10, 1998

[54] FAIL ANALYSIS DEVICE FOR SEMICONDUCTOR MEMORY TEST SYSTEM

[75] Inventor: Toshimi Ohsawa, Gyoda, Japan

[73] Assignee: Advantest Corp., Tokyo, Japan

[21] Appl. No.: 701,699

[22] Filed: Aug. 22, 1996

[30] Foreign Application Priority Data

Aug. 22, 1995 [JP] Japan ................................. 7-237792

[51] Int. Cl.$^6$ ................................................ G06F 11/00
[52] U.S. Cl. ................................ 371/5.1; 371/21.2
[58] Field of Search .......................... 371/5.1, 5.3, 5.4, 371/21.1, 21.2, 21.3, 21.6, 27; 365/201

[56] References Cited

U.S. PATENT DOCUMENTS

| | | | |
|---|---|---|---|
| 5,400,342 | 3/1995 | Matsumura et al. | 371/21.2 |
| 5,410,687 | 4/1995 | Fujisaki et al. | 365/201 |
| 5,539,699 | 7/1996 | Sato et al. | 365/201 |

*Primary Examiner*—Vincent P. Canney
*Attorney, Agent, or Firm*—Muramatsu & Associates

[57] ABSTRACT

A fail analysis device is to count the number of fails with respect to a memory under test detected during the test. The fail analysis device includes: a fail memory for storing fail data regarding the memory under test in an address defined by address data from a memory test system when a fail signal is detected by a logic comparator; an OR circuit to provide input data to the fail memory based on an OR function between the fail signal from the logic comparator and data stored in the fail memory in an address defined by the address data; a write enable control for supplying an write enable signal to said fail memory based on the fail signal; an AND circuit which is provided with the fail signal from the logic comparator and the data stored in the fail memory in an address defined by the address data for transferring the fail signal when the data from the fail memory indicates that the fail data has not been stored in the address; and a fail counter for counting the number of the fail signal transferred from the AND circuit during a process of testing the memory under test by the memory test system.

6 Claims, 5 Drawing Sheets

FIG. 2A CLOCK
FIG. 2B ADDRESS
FIG. 2C DATA OUT
FIG. 2D FAIL Sig
FIG. 2E ANDout

FIG. 2G FAIL COUNT

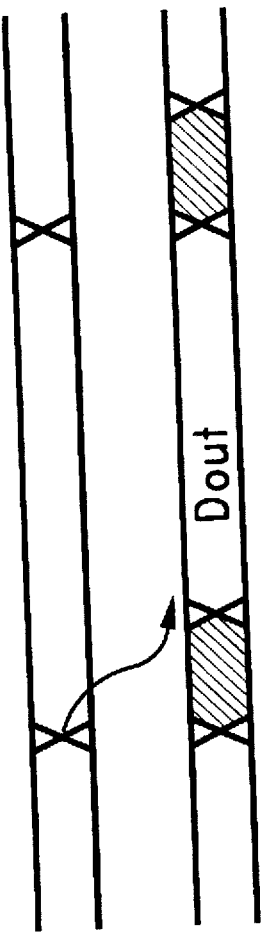
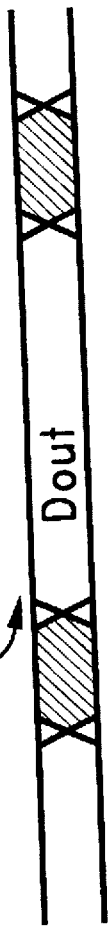
FIG. 5A CLOCK
FIG. 5B ADDRESS
FIG. 5C DATA OUT
FIG. 5D FAIL Sig
FIG. 5E DATA IN
FIG. 5F WE

FAIL ANALYSIS DEVICE FOR SEMICONDUCTOR MEMORY TEST SYSTEM

FIELD OF THE INVENTION

This invention relates to a fail analysis device to be used in a semiconductor memory test system, and more particularly, to a fail analysis device which can count, with high speed, a number of fails in a memory under test detected by a semiconductor memory test system.

BACKGROUND OF THE INVENTION

In testing a semiconductor memory device by a semiconductor memory test system, test pattern signals are applied to the memory under test and the resulted output signals are compared with expected data to determine whether the memory functions correctly or not. A basic structure of a semiconductor memory test system is shown in a block diagram of FIG. 3 which includes a timing generator 10, a pattern generator 11, a wave formatter 12, a logic comparator 13, and a fail memory 14.

Address data and test data in a signal pattern generated by the pattern generator 11 are applied to a memory under test (MUT) after being wave-shaped by the wave formatter 12. The logic comparator 13 determines either pass or fail for the data output from each address of the MUT by comparing the output data with the expected data generated by the pattern generator 11. When there is a mismatch between the output data of the MUT and the expected data, the comparator 13 generates a fail signal. The fail memory 14 stores the fail information for each address of the MUT based on the fail signal from the logic comparator 13 and the address data from the pattern generator 11. All of the foregoing operations are performed in synchronism with a system clock generated by the timing generator and provided to each block of the test system.

FIG. 4 is a block diagram showing an example of a conventional fail analysis device including a fail memory. FIG. 5 is a timing chart showing an operation of the fail analysis device of FIG. 4 when fail bit memories $30_a$–$30_n$ store the fail information. The fail analysis device includes a fail memory which is structured by a plurality of fail bit memories $30_a$–$30_n$, a plurality of OR gates $32_a$–$32_n$, an address selector 21, a write enable control 24 and a fail counter 23. In this example, the fail information is stored in the fail bit memories $30_a$–$30_n$ through a read/modify/write operation.

In the read/modify/write operation, a read operation and a write operation with respect to each address of the fail bit memory are performed within one cycle of the system clock. Either the data stored information obtained by the read operation or the fail information newly provided from the logic comparator 13 is stored in the fail bit memory 30 in the write operation. Such an OR function is performed in each of the OR gates $32_a$–$32_n$ provided at the input of the fail bit memory 30. Therefore, the fail information is accumulated in the fail bit memory 30.

In this example, the fail bit memories $30_a$–$30_n$ form a multi-bit memory which operates n-bits in parallel at the same time and have a memory capacity which is equal to or greater than the capacity of the MUT. The address data is commonly provided to the fail bit memories $30_a$–$30_n$, the write operations of which are commonly controlled by a write enable signal/WE. The write enable signal/WE is generated by the write enable control 24 based on the fail signals from the logic comparator 13.

As shown in FIG. 4, the fail signals ($Fail_a$–$Fail_n$) from the logic comparator 13 are provided to the data inputs ($Din_a$–$Din_n$) of the fail bit memories $30_a$–$30_n$ and also to the write enable control 24 which controls the write operation of the fail bit memories $30_a$–$30_n$. The address signal from the pattern generator 11 and the read/write address from the system bus are multiplexed by the address selector 21 and the selected address is commonly provide to the address inputs Ain of the fail bit memories $30_a$–$30_n$. The write enable control 24 generates the write enable signal/WE for only the cycle during which the fail is detected by the logic comparator 13. The write enable signal/WE is provided to the fail bit memories $30_a$–$30_n$ to write the input data in the memories $30_a$–$30_n$ through the OR gates $32_a$–$32_n$.

By the write enable signal/WE, the plural bits of fail information are accumulated at the same time in the fail bit memory 30 (fail memory 14) through the OR gates $32_a$–$32_n$. FIG. 5 shows this operation taken place in the fail analysis device of FIG. 4. By the address data of FIG. 5B produced by the pattern generator 11 at the timing of the system clock of FIG. 5A, the data is read out from the fail bit memory 30 as shown in FIG. 5C.

The fail data of FIG. 5D from the logic comparator 13 is provided to the OR gate 32 whose other input is provided with the output data of the fail bit memory 30 shown in FIG. 5C. The OR gate performs the OR function of the fail data of FIG. 5D and the output data of FIG. 5C and produces input data of FIG. 5E to be stored in the fail bit memory 30. By the write enable signal/WE of FIG. 5F from the write enable control 24, the input data shown in FIG. 5F is stored in the fail bit memory 30 at the address defined by the address data of FIG. 5B. As note in the foregoing operation, the fail data in the fail bit memory is renewed by the newly coming fail data.

The address selector 21 selects either the address data from the pattern generator 11 or address data from a system data bus. The address data from the pattern generator 11 is used for storing the fail data during the test of the MUT while the address data from the system bus is used to read and write the fail data after the test.

During the test of the MUT, the address data from the pattern generator 11 is commonly provided to the fail bit memories $30_a$–$30_n$. After the test, address selector 21 selects the address data from the system bus to access the fail bit memories $30_a$–$30_n$ for a fail analysis purpose, i.e., such as for counting the total number of fails or reading the fail data in each address of the fail memory to formulate a fail map of the MUT.

The fail number counter 23 counts the fail information from the fail bit memories $30_a$–$30_n$ to determine an overall number of fails with respect to the MUT. For example, in synchronism with the system clock, the fail counter 23 accumulates the number of data "1" in the output of the fail bit memories $30_a$–$30_n$.

As in the foregoing, in the conventional memory test system, the process of counting the fail number for each data bit or for overall MUT addresses must by performed after the test for the memory under test. This is because, in a semiconductor memory testing, the same address of the MUT is accessed two or more times in using an algorithmic test pattern. If all the fails are counted during the test in the conventional circuit arrangement, a plurality of fails are added for the same address of the MUT. Therefore, it is not possible to accurately count the overall number of fails in the MUT during the test.

SUMMARY OF THE INVENTION

It is, therefore, an object of the present invention to provide a fail analysis device which can count, with high speed and accuracy, a number of fails in a memory under test detected by a semiconductor memory test system during the test of the memory.

The fail analysis device of the present invention counts the number of fails during the process of the memory test rather than after the memory test. That is, the fail number is counted while applying the test signals to the memory under test and comparing the resulted output from the memory under test with the expected data.

In the present invention, the fail analysis device for a semiconductor memory test system includes: a fail memory for storing fail data regarding the memory under test in an address defined by address data from the memory test system when a fail signal is detected by a logic comparator in the memory test system; an OR circuit to provide input data to the fail memory based on an OR function between the fail signal from the logic comparator and data stored in the fail memory in an address defined by the address data; a write enable control for generating an write enable signal to be supplied to the fail memory based on the fail signal from the logic comparator; an AND circuit which is provided with the fail signal from the logic comparator and the data stored in the fail memory in an address defined by the address data for transferring the fail signal when the data from the fail memory indicates that the fail data has not been stored in the address; and a fail counter for counting the number of the fail signal transferred from the AND circuit during a process of testing the memory under test by the memory test system.

According to the present invention, the fail analysis device can count, with high speed and accuracy, the number of fails in a memory under test detected by a semiconductor memory test system during the test of the memory. This is because the fail signal is counted by the fail number counter only when the fail data has not been attained in the address of the fail bit memory in question. As a result, even if the same address of the memory under test is accessed a plurality of times during the memory test, and thus the fail signals are generated by the logic comparator every time when the defective address of the memory under test is accessed, only one fail is recognized and counted by the fail analysis device for this address.

BRIEF DESCRIPTION OF THE DRAWINGS

FIG. 5 is a timing chart showing an operation for counting the fail number by the conventional fail analysis device of FIG. 4.

DETAILED DESCRIPTION OF THE PREFERRED EMBODIMENT

Figure 1:
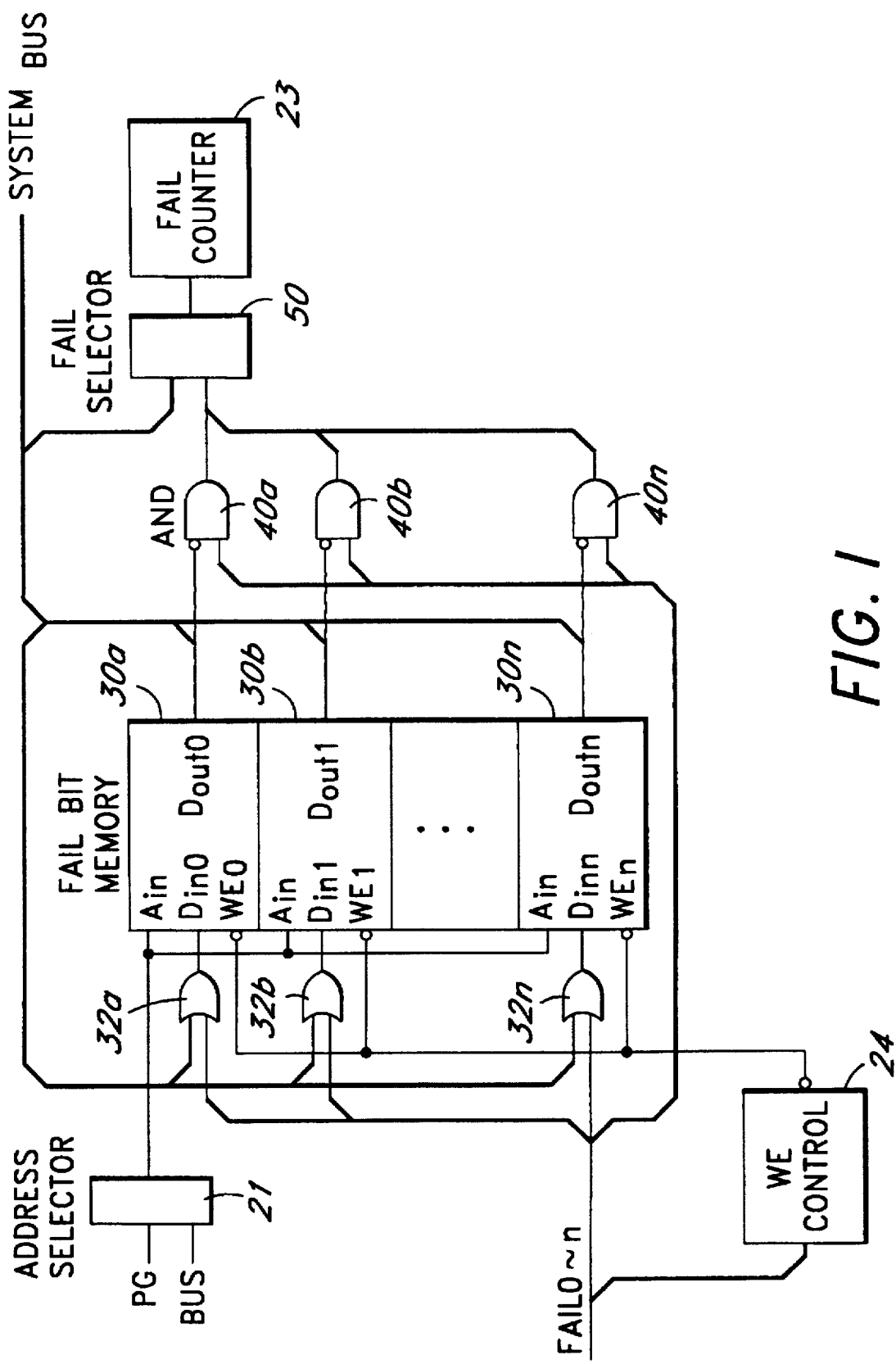
FIG. 1 is a block diagram showing an example of circuit configuration of a fail analysis device of the present invention.
Figure 3:
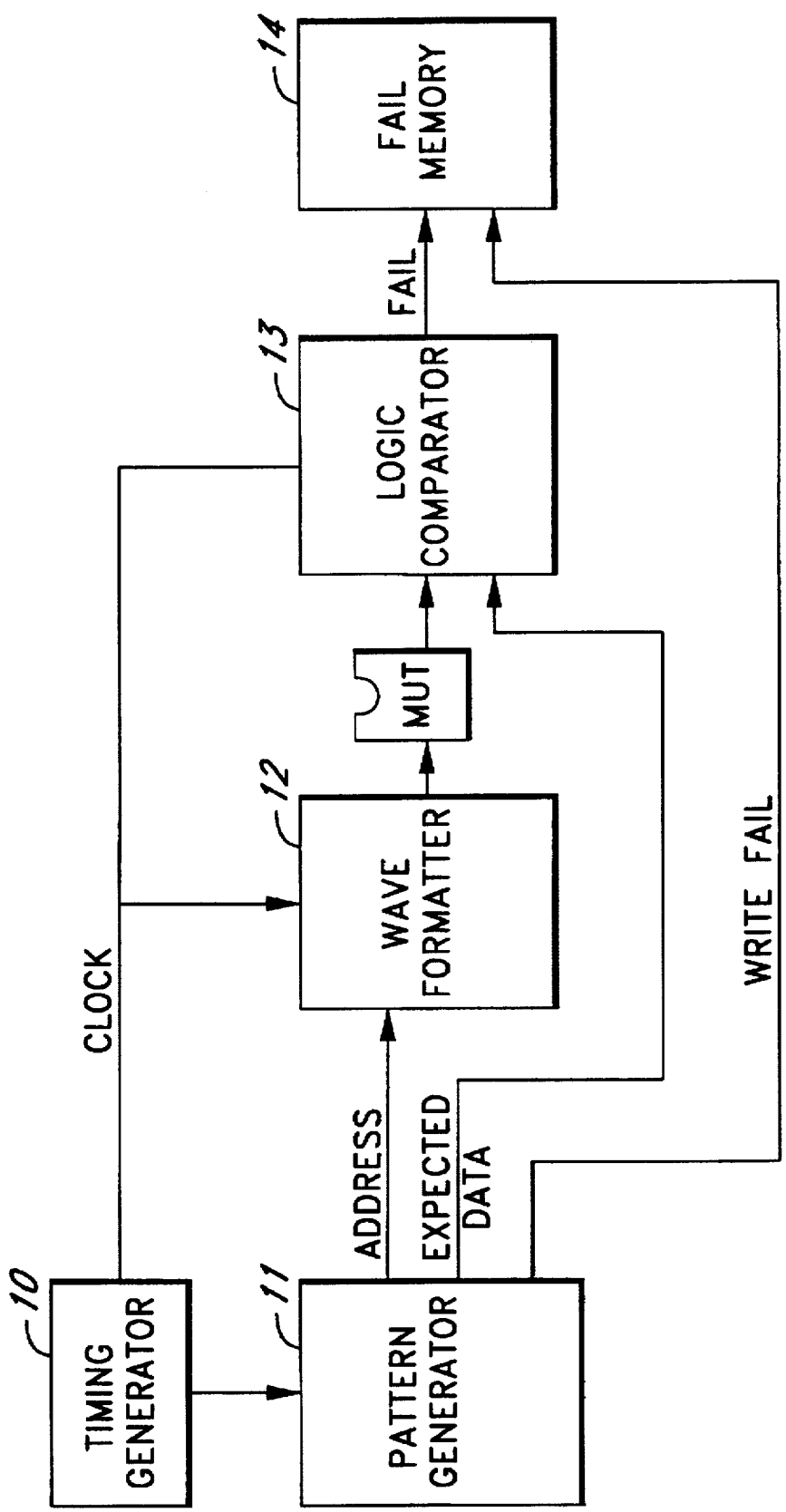
FIG. 3 is a schematic diagram for showing a general structure of a semiconductor memory test system.
Figure 4:
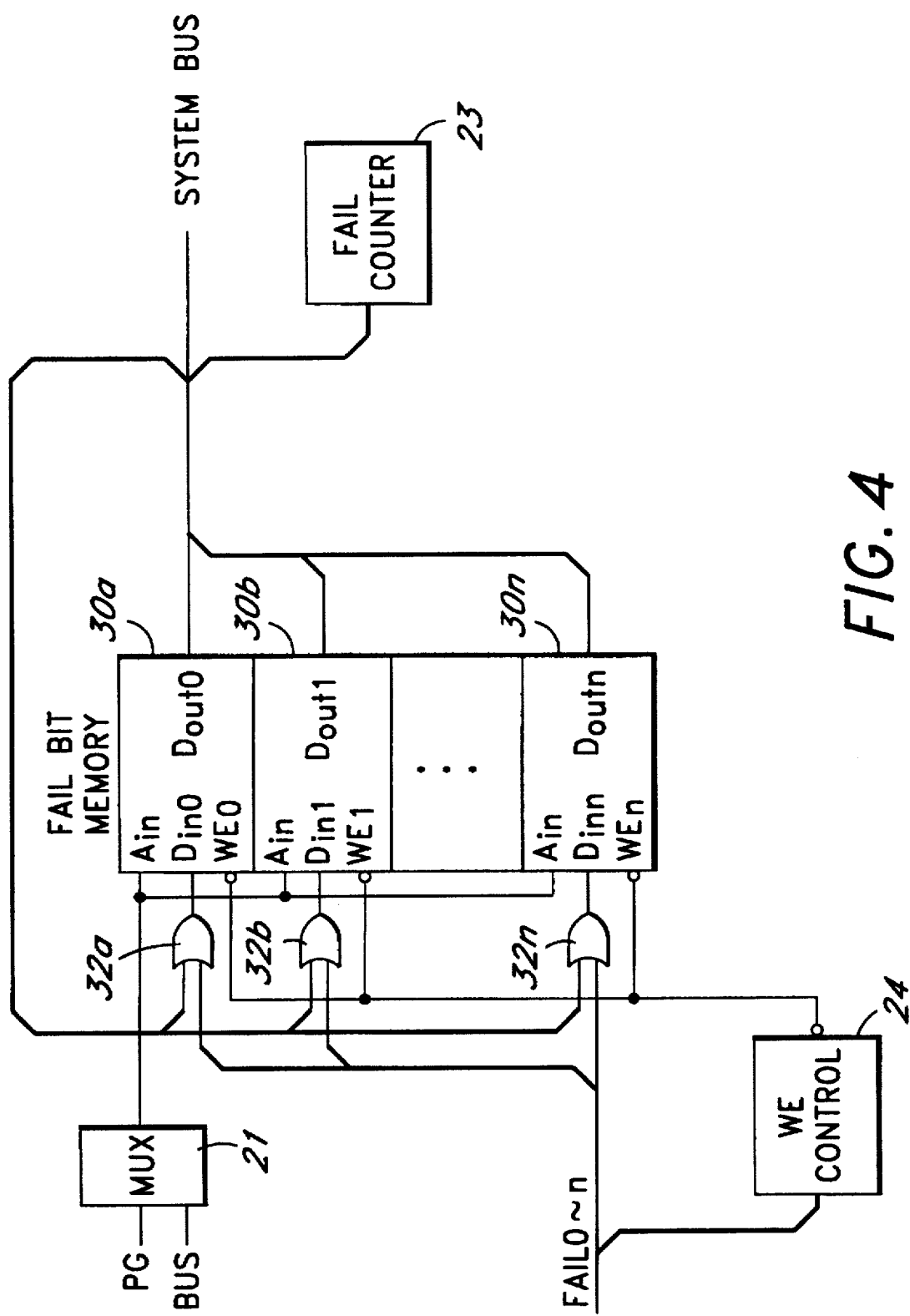
FIG. 4 is a block diagram showing a conventional circuit configuration of the fail analysis device.

FIG. 1 shows an example of the fail analysis device of the present invention in which the same reference numerals and letters as used in FIGS. 3 and 4 designate the corresponding parts of the fail analysis device. As shown in FIG. 1, the fail analysis device of the present invention additionally includes AND gates $40_a$–$40_n$ and a fail selector 50.

The other circuit elements such as the address selector 21, the fail bit memories $30_a$–$30_n$, the fail number counter 23, and the write enable control 24 are the same as the conventional device shown in FIG. 4. As in the conventional device, the fail analysis device of the present invention functions the read/modify/write operation in storing the fail information.

The inputs of the AND gates $40_a$–$40_n$ are connected to the logic comparator 13 to directly receive the fail signals from the logic comparator 13. The other inputs of the AND gates $40_a$–$40_n$ are connected to the fail bit memories $30_a$–$30_n$. The fail selector 50 is provided with the data output from the fail bit memories $30_a$–$30_n$ and the outputs of the AND gates $40_a$–$40_n$. The fail selector 50 selects the outputs of the AND gates $40_a$–$40_n$ during the memory test and the data output of the fail bit memories $30_a$–$30_n$ after the memory test. The selected output data from the fail selector 50 is fed to the fail number counter 23 wherein the number of fails is counted.

Thus, the fail number is counted with high speed by counting the output from the fail selector during the memory test, i.e., while applying the test signal to the MUT and comparing the resulted output of the MUT with the expected data. As in the conventional fail analysis process, the fail analysis device of the present invention can also count the fails in the fail memory 14 and obtains the overall fail numbers after the memory test.

This operation is explained in more detail below. The AND gates $40_a$–$40_n$ function to determine whether the fail signal from the logic comparator should be counted while writing the fail data in the fail bit memories $30_a$–$30_n$. As shown in FIG. 1, in this example, one input of each AND gate 40 is an inverted terminal. The output data from the fail bit memory 30 is provided to the inverted terminal of the AND gate 40.

Therefore, when the fail signal "1" from the logic comparator 13 is received by the AND gate 40, it is determined whether the fail data is already exist in the same address of the fail bit memory 30. When the fail data "1" is read from the fail bit memory 30, because of the inverted terminal of the AND gate 40, the output of the AND gate will not supplied to the fail selector 50. Conversely, when the fail signal "1" from the logic comparator 13 is received by the AND gate 40 but the corresponding output data from the fail bit memory 30 is "0", the AND gate is opened so that the fail signal is supplied to the fail selector 50.

In this manner, the fail signal is counted by the fail number counter 23 only when the fail data has not been attained in the corresponding address of the fail bit memory 30. As a result, even if the same address of the MUT is accessed many times during the memory test, and thus the fail signal is generated by the logic comparator 13 every time when this address of the MUT is accessed, the fail number is counted by one for this address.

FIG. 2 is a timing chart showing the operation of the fail analysis device of the present invention. By the address data of FIG. 2B produced by the pattern generator 11 at the timing of the system clock of FIG. 2A, the data is read out from the fail bit memory 30 as shown in FIG. 2C. The data read out from the fail bit memory 30 is provided to the AND gate 40 and to the OR gate 32.

The fail data of FIG. 2D from the logic comparator 13 is provided to the OR gate 32 whose other input is provided with the output data of the fail bit memory 30 shown in FIG. 5C. The OR gate 32 performs the OR function of the fail data of FIG. 2D and the output data of FIG. 2C and produces input data to be stored in the fail bit memory 30. By the write enable signal/WE generated by the write enable control 24 of FIG. 1, the input data from the OR gate 32 is stored in the fail bit memory 30 at the address defined by the address data of FIG. 2B. As note in the foregoing operation, the fail data in the fail bit memory 30 is renewed by the new fail data.

Figure 2F:
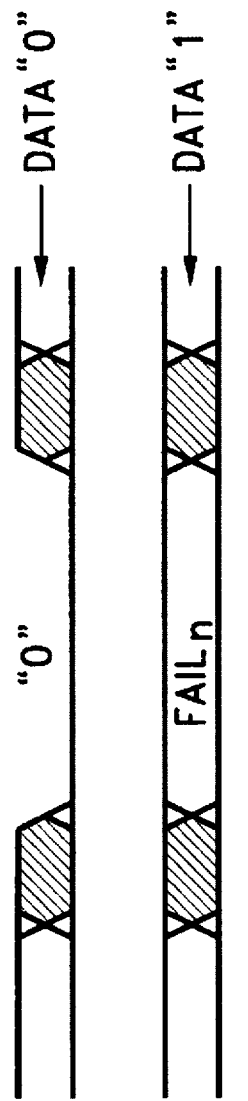
FIG. 2 is a timing chart showing an operation for counting the fail number by the fail analysis device of the present invention.

When the data of FIG. 2C from the fail bit memory 30 is "1", the output of the AND gate 40 does not provide the fail signal from the logic comparator 13 to the fail number counter 23 as shown in FIG. 2E, since there is already stored the fail data in the memory 30. When the output data from the fail bit memory 30 is in low level, thus, there is no fail data stored in the address, the fail signal of FIG. 2D is provided at the output of the AND gate 40 as shown in FIG. 2F to be counted by the fail number counter 23 as in FIG. 2G.

In the foregoing, it is explained that the fail number counter 23 is used to obtain the overall fail number. The fail number counter may also be used to count the predetermined number of fails. For example, if the number of fails in the MUT reaches a certain number "n", the semiconductor memory test system may determine that the MUT is no longer repairable. In the present invention, it is also possible to include two or more fail number counters, for example, for each fail bit memory 30.

As has been foregoing, according to the present invention, the fail analysis device can count, with high speed and accuracy, the number of fails in a memory under test detected by a semiconductor memory test system during the test of the memory. This is because the fail signal is counted by the fail number counter only when the fail data has not been attained in the address of the fail bit memory in question. As a result, even if the same address of the memory under test is accessed a plurality of times during the memory test, and thus the fail signals are generated by the logic comparator every time when the defective address of the memory under test is accessed, only one fail is recognized and counted by the fail analysis device for this address.

What is claimed is:

1. A fail analysis device to be used in a semiconductor memory test system for analyzing fail information of a memory under test, comprising:

a fail memory for storing fail data regarding said memory under test in an address defined by address data from said memory test system when a fail signal is detected by a logic comparator in said memory test system;

an OR circuit to provide input data to said fail memory based on an OR function between said fail signal from said logic comparator and data stored in said fail memory in an address defined by said address data;

a write enable control for generating an write enable signal to be supplied to said fail memory based on said fail signal from said logic comparator;

an AND circuit which is provided with said fail signal from said logic comparator and said data stored in said fail memory in an address defined by said address data for transferring said fail signal when said data from said fail memory indicates that the fail data has not been stored in said address; and a fail counter for counting the number of said fail signal transferred from said AND circuit during a process of testing said memory under test by said semiconductor memory test system.

2. A fail analysis device as defined in claim 1, further comprising:

an address selector for selecting either address data concurrently provided to said memory under test during the test of said memory or address data provided after said test, said address selector supplying said selected address data to said fail memory; and an fail selector for selectively supplying either said fail signal from said AND circuit or said data from said fail memory to said fail counter.

3. A fail analysis device as defined in claim 1 wherein said fail memory is formed of a plurality of fail bit memories to receive a plural bits of input data in parallel, and said OR circuit and said AND circuit are respectively formed of a plurality of OR gates and AND gates corresponding to said plurality of fail bit memories.

4. A fail analysis device for analyzing fail information of a memory under test, comprising:

a pattern generator for generating address data to be supplied to said memory under test, test data to be input to said memory under test, and expected data to be compared with an output signal from said memory under test;

a logic comparator for comparing said output signal from said memory under test with said expected data and generating a fail signal when said output signal and said expected data do not match with each other;

a fail memory for storing fail data regarding said memory under test in an address defined by said address data from said pattern generator when said fail signal is generated by said logic comparator;

an OR circuit to provide input data to said fail memory based on an OR function between said fail signal from said logic comparator and data stored in said fail memory in an address defined by said address data;

a write enable control for generating an write enable signal to be supplied to said fail memory based on said fail signal from said logic comparator;

an AND circuit which is provided with said fail signal from said logic comparator and said data stored in said fail memory in an address defined by said address data for transferring said fail signal when said data from said fail memory indicates that the fail data has not been stored in said address; and a fail counter for counting the number of said fail signal transferred from said AND circuit during a process of testing said memory under test by said semiconductor memory test system.

5. A fail analysis device as defined in claim 4, further comprising:

an address selector for selectively supplying either address data generated by said pattern generator during the test of said memory or address data through a system bus of a semiconductor memory test system provided after said test; and an fail selector for selectively supplying either said fail signal from said AND circuit or said data from said fail memory to said fail counter.

6. A fail analysis device as defined in claim 4 wherein said fail memory is formed of a plurality of fail bit memories to receive a plural bits of fail signal from said logic comparator in parallel, and said OR circuit and said AND circuit are respectively formed of a plurality of OR gates and AND gates corresponding to said plurality of fail bit memories.

* * * * *